United States Patent
Jung et al.

(10) Patent No.: US 9,759,971 B2
(45) Date of Patent: Sep. 12, 2017

(54) ARRAY SUBSTRATE AND LIQUID CRYSTAL DISPLAY INCLUDING THE SAME

(71) Applicant: Samsung Display Co., Ltd., Yongin (KR)

(72) Inventors: Hyo Ju Jung, Incheon (KR); Jang Wi Ryu, Seoul (KR); Hak Sun Chang, Yongin-si (KR); Ki Chul Shin, Seongnam-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 122 days.

(21) Appl. No.: 14/679,349

(22) Filed: Apr. 6, 2015

(65) Prior Publication Data

US 2016/0109774 A1    Apr. 21, 2016

(30) Foreign Application Priority Data

Oct. 17, 2014 (KR) .......................... 10-2014-0140799

(51) Int. Cl.
| | |
|---|---|
| *G02F 1/1343* | (2006.01) |
| *G02F 1/1362* | (2006.01) |
| *H01L 27/12* | (2006.01) |
| *G02F 1/1337* | (2006.01) |

(52) U.S. Cl.
CPC .. *G02F 1/136286* (2013.01); *G02F 1/133707* (2013.01); *H01L 27/124* (2013.01); *G02F 2001/134345* (2013.01)

(58) Field of Classification Search
CPC ... G02F 1/136286; G02F 2001/134345; G02F 1/133707; H01L 27/124

USPC .......................................... 349/48, 142–146
See application file for complete search history.

(56) References Cited

U.S. PATENT DOCUMENTS

| | | | |
|---|---|---|---|
| 7,880,949 B1 * | 2/2011 | Chu-Ke | ........... G02F 1/13624 349/43 |
| 8,035,787 B2 | 10/2011 | Jung et al. | |
| 8,253,908 B2 | 8/2012 | Jung et al. | |
| 8,427,621 B2 | 4/2013 | Jung et al. | |

(Continued)

FOREIGN PATENT DOCUMENTS

| | | |
|---|---|---|
| KR | 10-2009-0103461 | 10/2009 |
| KR | 10-2011-0111227 | 10/2011 |

(Continued)

*Primary Examiner* — Charles Chang
(74) *Attorney, Agent, or Firm* — H.C. Park & Associates, PLC

(57) ABSTRACT

An array substrate includes: first and second gate lines extending along a first direction; a data line extending along a second direction crossing the first direction, and being insulated from the first and second gate lines; a pixel electrode disposed in a pixel area defined by the data line, the first gate line, and the second gate line; a first auxiliary electrode overlapping the first gate line; and a second auxiliary electrode disposed between the pixel electrode and the second gate line, the second auxiliary electrode being spaced apart from the second gate line. The pixel electrode includes: a first subpixel electrode disposed adjacent to the first gate line, and having first direction size greater than a second direction size; and a second subpixel electrode spaced apart from the first subpixel electrode in the second direction, and having a first direction size greater than a second direction size.

20 Claims, 14 Drawing Sheets

(56) References Cited

U.S. PATENT DOCUMENTS

| | | |
|---|---|---|
| 8,462,305 B2 | 6/2013 | Jung et al. |
| 8,610,866 B2 | 12/2013 | Jung et al. |
| 8,909,020 B2 | 12/2014 | Jung et al. |
| 2005/0253797 A1* | 11/2005 | Kamada ............ G02F 1/133753 345/89 |
| 2006/0215066 A1* | 9/2006 | Ueda ................. G02F 1/134309 349/38 |
| 2008/0198285 A1* | 8/2008 | Hsieh ................... G09G 3/3659 349/39 |
| 2009/0322977 A1* | 12/2009 | Chung ............. G02F 1/136259 349/48 |
| 2013/0044094 A1* | 2/2013 | Li ....................... G09G 3/3406 345/211 |
| 2015/0062516 A1 | 3/2015 | Jung et al. |
| 2015/0243240 A1 | 8/2015 | Ryu et al. |

FOREIGN PATENT DOCUMENTS

| | | |
|---|---|---|
| KR | 10-2012-0104720 | 9/2012 |
| KR | 10-2015-0101058 | 9/2015 |

* cited by examiner (a)　　　　　　　　(b)

ARRAY SUBSTRATE AND LIQUID CRYSTAL DISPLAY INCLUDING THE SAME

CROSS-REFERENCE TO RELATED APPLICATION

This application claims priority from and the benefit of Korean Patent Application No. 10-2014-0140799, filed on Oct. 17, 2014, which is incorporated by reference for all purposes as if fully set forth herein.

BACKGROUND

Field

Exemplary embodiments relate to display technology, and, more particularly, to an array substrate and a liquid crystal display (LCD) including the same.

Discussion

Liquid crystal displays (LCDs) are one of many different types of flat panel displays. Generally, an LCD includes a pair of display substrates having electric field generating electrodes, such as pixel electrodes and a common electrode, and a liquid crystal layer disposed between the display substrates. The LCD generates an electric field in the liquid crystal layer by applying voltages to the electric field generating electrodes. Accordingly, the alignment of liquid crystal molecules of the liquid crystal layer is changed, and polarization of incident light is controlled. As a result, an image is displayed via the LCD.

Conventional LCDs include various types, such as vertical alignment (VA) mode LCDs. In VA mode LCDs, liquid crystal molecules are aligned, such that their long axis is perpendicular to display substrates when no electric field is applied to the liquid crystal molecules. A wide viewing angle may be achieved by forming slits (such as micro slits) or protrusions on electric field generating electrodes of a VA mode LCD. The slits and protrusions may determine a direction in which liquid crystal molecules tilt. As such, the slits and/or protrusions may be disposed to make the liquid crystal molecules tilt in various directions to widen the view angle. It is recognized, however, that if the micro slits/protrusions are formed in a pixel electrode among the electric field generating electrodes, the response speed of the liquid crystal molecules may be reduced due to other liquid crystal controllability factors. To this end, a possibility arises that texture may be displayed for a certain period of time.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an array substrate to improve display quality and a liquid crystal display (LCD) including the same.

Additional aspects will be set forth in the detailed description which follows, and, in part, will be apparent from the disclosure, or may be learned by practice of the inventive concept.

According to exemplary embodiments, an array substrate includes a first gate line and a second gate line, the first and second gate lines extending substantially along a first direction; a data line extending substantially along a second direction crossing the first direction, the data line being insulated from the first and second gate lines; a pixel electrode disposed in a pixel area defined in association with the data line, the first gate line, and the second gate line; a first auxiliary electrode overlapping the first gate line; and a second auxiliary electrode disposed between the pixel electrode and the second gate line, the second auxiliary electrode being spaced apart from the second gate line. The pixel electrode includes: a first subpixel electrode disposed adjacent to the first gate line, a size of the first subpixel electrode in the first direction being greater than a size of the first subpixel electrode in the second direction; and a second subpixel electrode spaced apart from the first subpixel electrode in the second direction, a size of the second subpixel electrode in the first direction being greater than a size of the second subpixel electrode in the second direction.

According to exemplary embodiments, a display apparatus includes a first substrate, a second substrate spaced apart from the first substrate, the second substrate including a common electrode, and a liquid crystal layer disposed between the first substrate and the second substrate. The first substrate includes a first gate line and a second gate line, the first and second gate lines extending substantially along a first direction; a data line extending substantially along a second direction crossing the first direction, the data line being insulated from the first and second gate lines; a pixel electrode disposed in a pixel area defined in association with the data line, the first gate line, and the second gate line; a first auxiliary electrode overlapping the first gate line; and a second auxiliary electrode disposed between the pixel electrode and the second gate line, the second auxiliary electrode being spaced apart from the second gate line. The pixel electrode includes: a first subpixel electrode disposed adjacent to the first gate line, a size of the first subpixel electrode in the first direction being greater than a size of the first subpixel electrode in the second direction; and a second subpixel electrode spaced apart from the first subpixel electrode in the second direction, a size of the second subpixel electrode in the first direction being greater than a size of the second subpixel electrode in the second direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
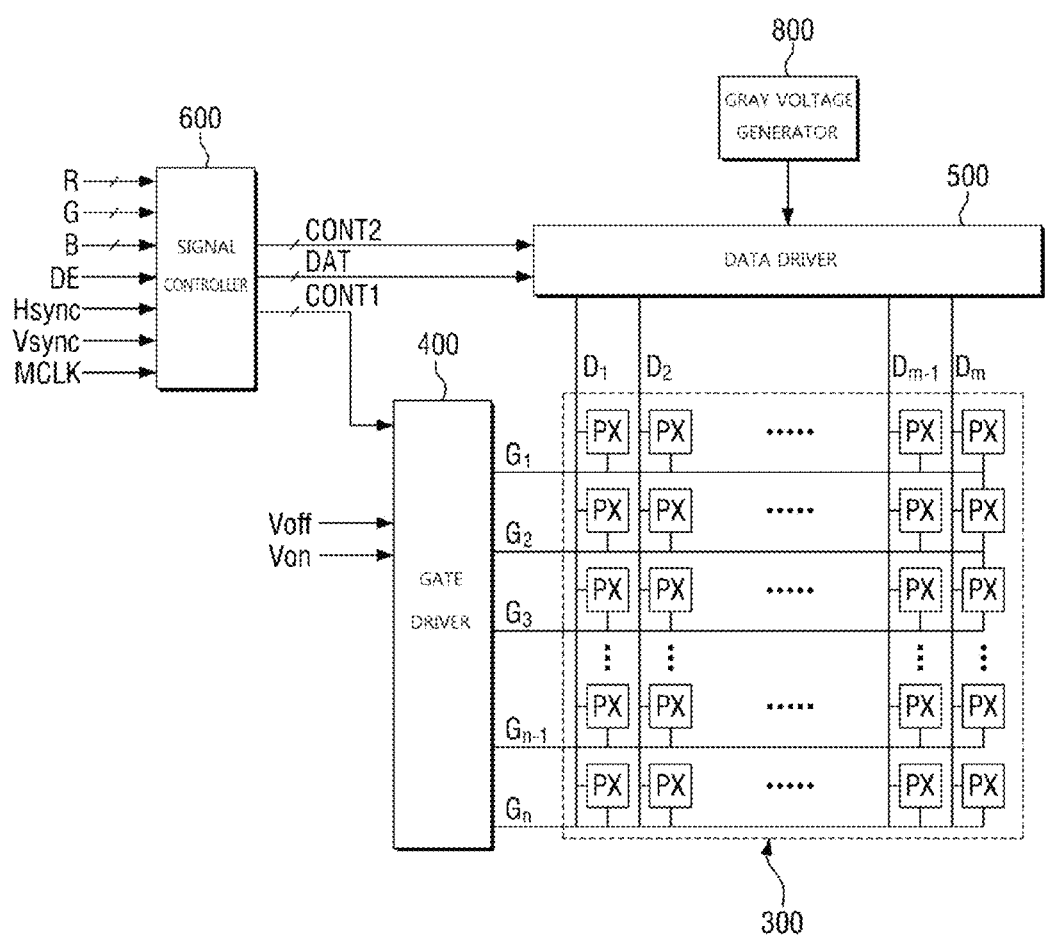
FIG. 1 is a block diagram of a liquid crystal display (LCD), according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
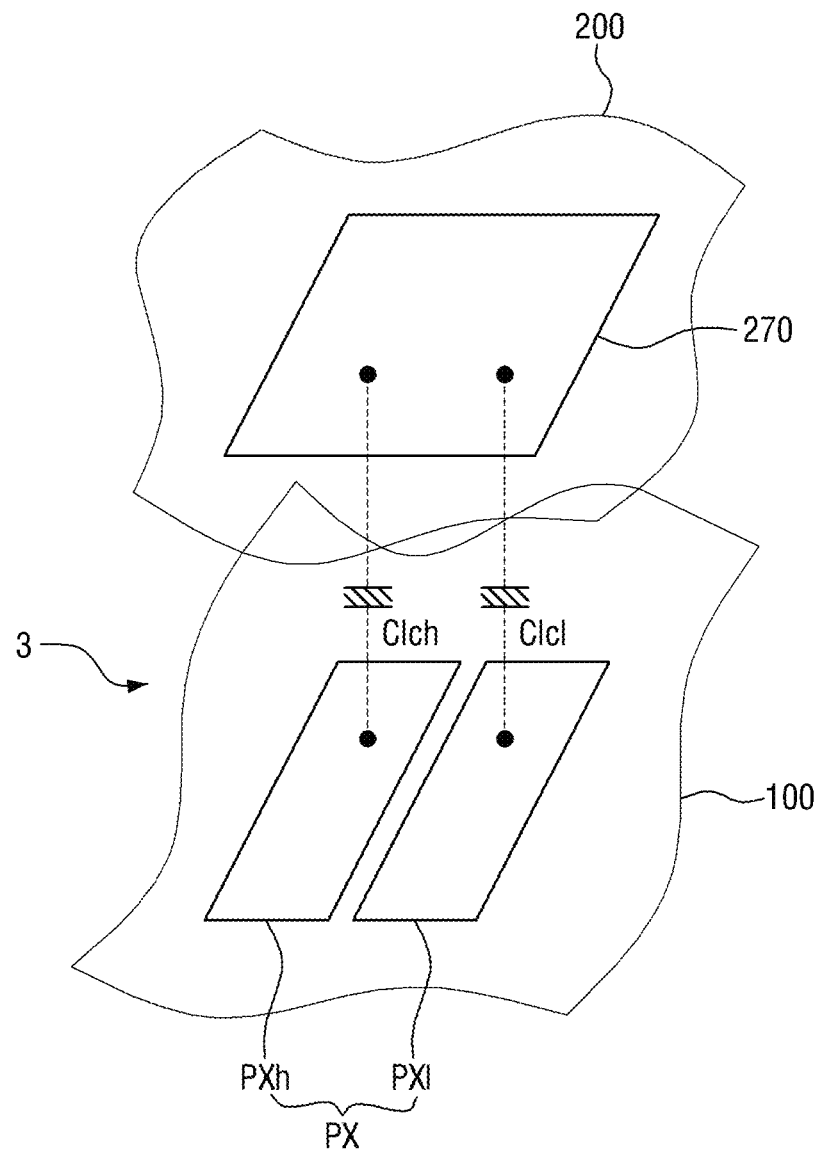
FIG. 2 illustrates a schematic structure of a pixel of the LCD of FIG. 1, according to exemplary embodiments.

FIG. 1 is a block diagram of a liquid crystal display (LCD), according to exemplary embodiments. FIG. 2 illustrates a schematic structure of a pixel PX of the LCD of FIG. 1. Referring to FIGS. 1 and 2, the LCD may include a display panel 300, a gate driver 400, a data driver 500, a signal controller 600, and a gray voltage generator 800. Although specific reference will be made to this particular implementation, it is also contemplated that the LCD may embody many forms and include multiple and/or alternative components. For example, it is contemplated that the components of the LCD may be combined, located in separate structures, and/or separate locations.

The signal controller 600 may receive, from a host, image signals R, G, and B, and control signals including a data enable signal DE, horizontal and vertical synchronization signals Hsync and Vsync, and a clock signal MCLK. The signal controller 600 may output data control signals CONT2 and image data signals DAT to the data driver 500 and output gate control signals CONT1 for selecting gate lines to the gate driver 400. The signal controller 600 may output light source control signals (not illustrated) to a light source generator (not illustrated) in order to adjust a light source.

The gray voltage generator 800 may generate all gray voltages or a limited number of gray voltages (hereinafter, referred to as "reference gray voltages"), which may ultimately be supplied to pixels PX of the display panel 300, and output the generated gray voltages to the data driver 500. The reference gray voltages may be different in polarity from a common voltage Vcom, as will become more apparent in association with FIG. 9.

The data driver 500 may receive the reference gray voltages from the gray voltage generator 800 and output gray voltages to a plurality of data lines $D_1$ through $D_m$ in response to the control signals CONT2 and the image data signals DAT received from the signal controller 800. If the gray voltage generator 800 provides only a limited number of reference gray voltages, the data driver 500 may generate a greater number of extended gray voltages by, for instance, dividing the reference gray voltages. In association with supplying the extended gray voltages to the data lines $D_1$ through $D_m$, the data driver 500 may perform inversion driving that alternately applies, to each of the pixels PX, voltages, which are the same in voltage difference, but different in polarity in every frame with respect to the common voltage Vcom. Methods of inversion driving include, for example: frame inversion that supplies data voltages, such that in one frame, data voltages applied to all pixels PX are the same in polarity, and in the next frame, polarities of data voltages applied to all pixels PX are inverted; column inversion that supplies data voltages, such that within one frame, polarities of data voltages applied to pixels PX connected to adjacent data lines are inverted; dot inversion that supplies data voltages, such that voltage polarities of adjacent pixels PX are different from each other; and 2+1 inversion that supplies data voltages, such that two pixels PX adjacent to the same data line have the same polarity, and one pixel PX adjacent to the two same-polarity pixels PX has a different polarity on a repeated basis.

The gate driver 400 may sequentially output gate signals to a plurality of gate lines $G_1$ through $G_n$ in response to the gate control signals CONT1. Although the gate lines $G_1$ through $G_a$ are illustrated as overlapping the data lines $D_1$ through $D_m$ in FIG. 1 for illustrative purposes, it is noted that the gate lines $G_1$ through $G_n$ and the data lines $D_1$ through $D_m$ are not operatively connected to one another. Each of the gate signals may include a gate-on voltage Von configured to turn on thin-film transistors associated with a selected gate line and a gate-off voltage Voff configured to turn off thin-film transistors associated with unselected gate lines.

In exemplary embodiments, the gate driver 400, the data driver 500, the signal controller 600, the gray voltage generator 800, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the gate driver 400, the data driver 500, the signal controller 600, the gray voltage generator 800, and/or one or more components thereof may include or otherwise be associated with one or more memories (not shown) including code (e.g., instructions) configured to cause the gate driver 400, the data driver 500, the signal controller 600, the gray voltage generator 800, and/or one or more components thereof, to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

According to exemplary embodiments, the display panel 300 may include an array-substrate (or first substrate) 100, a counter-substrate (or second substrate) 200 facing the array substrate 100, and a liquid crystal layer 3 disposed between the array-substrate 100 and the counter-substrate 200. The array substrate 100 may include a plurality of pixels PX arranged in any suitable manner, e.g., in a matrix formation of rows and columns, a plurality of gate lines $G_1$ through $G_a$ each of which connect pixels PX in a respective row, and a plurality of data lines $D_1$ through $D_m$, each of which connect pixels PX in a respective column.

A pixel PX may be divided into a pair of subpixels, e.g., a first subpixel PXh and a second subpixel PX1. Subpixels PXh and PX1 may be separated (or otherwise spaced apart) from each other. A first subpixel electrode may be disposed in the first subpixel PXh, and a second subpixel electrode may be disposed in the second subpixel PX1. The first subpixel PXh may include liquid crystal capacitor Clch. The second subpixel PX1 may include liquid crystal capacitor Clcl. The first and second subpixels PXh and PX1 may include storage capacitors Csth and Cstl (not illustrated), respectively. The capacitance of each of the liquid crystal capacitors Clch and Clcl may be formed by a subpixel electrode formed on the array substrate 100, a common electrode 270 formed on the counter substrate 200, and the liquid crystal layer 3 disposed between the subpixel electrode and the common electrode 270. It is contemplated, however, that the first and second subpixels PXh and PX1 may be connected to different thin-film transistors that are connected to different data lines.

The common electrode 270 may be formed on the whole (or most of the) surface of the counter substrate 200, and may receive the common voltage Vcom. It is also contemplated that the common electrode 270 may be formed on the array substrate 100, and may exhibit a linear or bar-shaped configuration.

The liquid crystal layer 3 may be disposed between the array substrate 100 and the counter substrate 200. The liquid crystal layer 3 may function as a dielectric. Further, the liquid crystal layer 3 may include liquid crystal molecules having negative dielectric anisotropy, however, any other suitable type of liquid crystal molecules may be utilized in association with exemplary embodiments described herein. The array substrate 100 and the counter substrate 200 may be attached (or otherwise coupled) to each other via a sealant. The sealant may be formed along edges of the array substrate 100 and/or the counter substrate 200 to bond the array substrate 100 and the counter-substrate 200 together. It is contemplated, however, that any other suitable mechanism may be utilized to couple the array substrate 100 and the counter-substrate 200 to one another. The liquid crystal layer 3 may be disposed in a space between the array substrate 100, the counter substrate 200, and the sealant.

Polarizers (not illustrated) may be disposed on each of the array substrate 100 and the counter substrate 200, such that their polarization axes or transmission axes are substantially orthogonal to each other. It is also contemplated that the polarizers may be located on or under the counter substrate 200 and on or under the array substrate 100. Further, the polarizers may be formed on or under any one of the counter substrate 200 and the array substrate 100. The polarizers may have a refractive index of approximately 1.5 to reduce diffraction of external light, and may have a haze value of approximately 2 to 5%.

Figure 3:
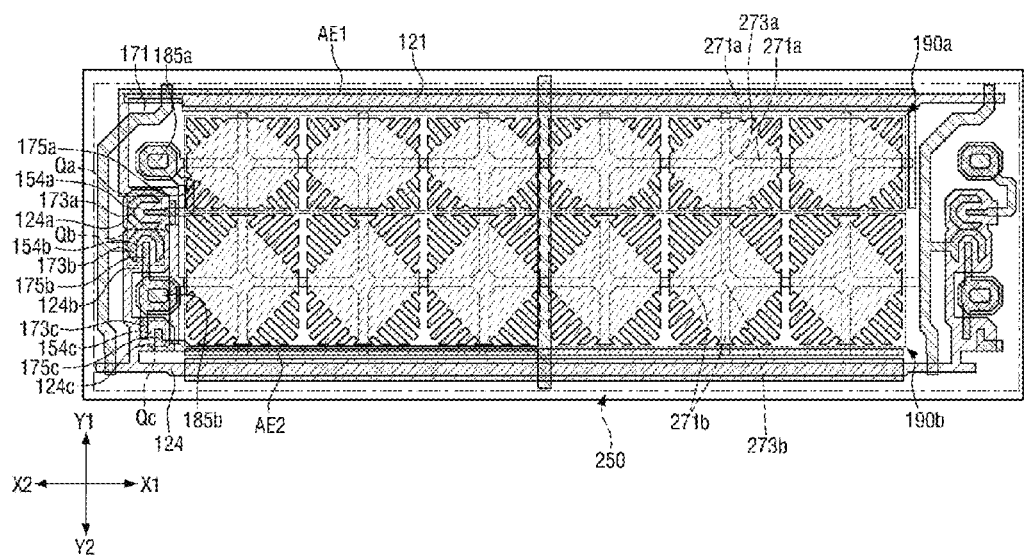
FIG. 3 is a layout view of a pixel of the LCD of FIG. 1, according to exemplary embodiments.
Figure 4:
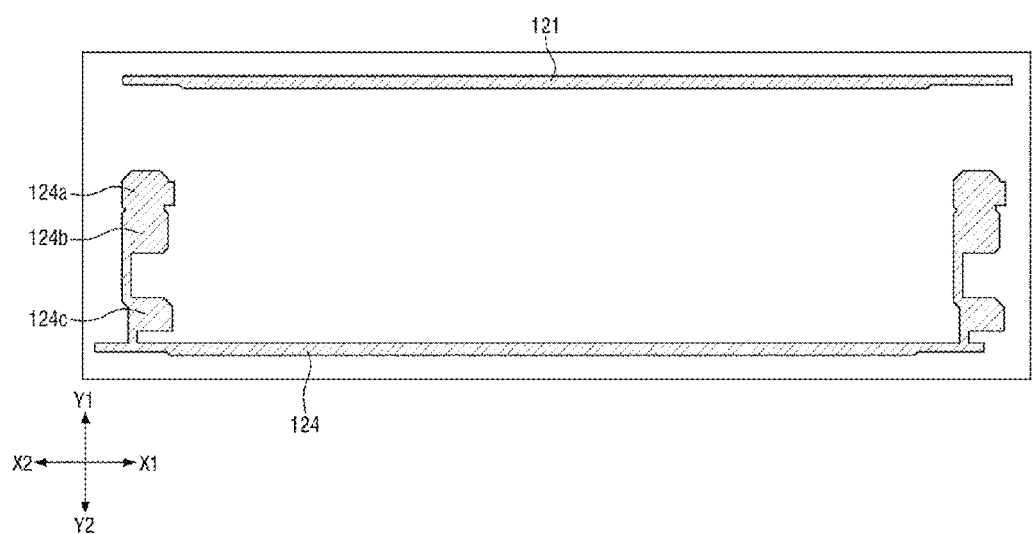
FIG. 4 is a layout view of a gate conductor separated from the LCD of FIG. 3, according to exemplary embodiments.
Figure 5:
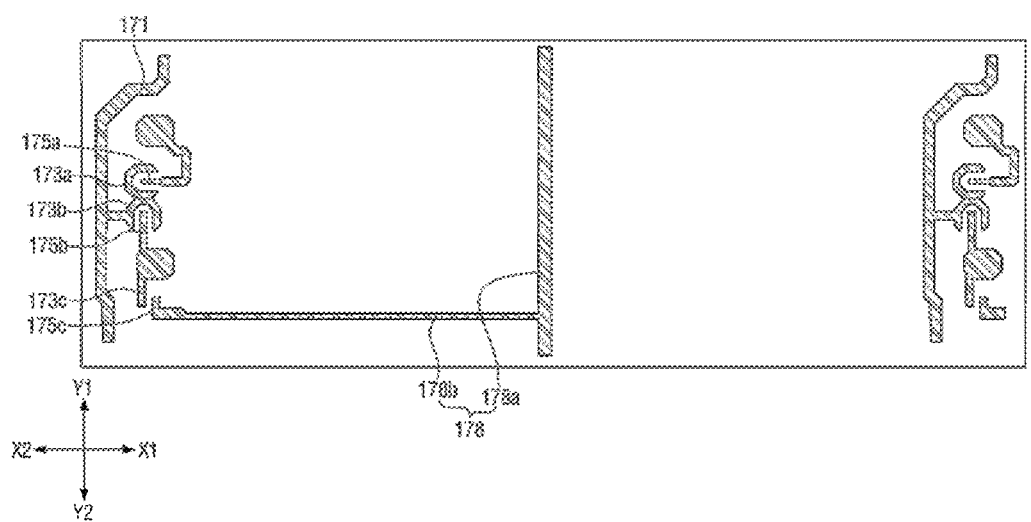
FIG. 5 is a layout view of a data conductor separated from the LCD of FIG. 3, according to exemplary embodiments.
Figure 6:
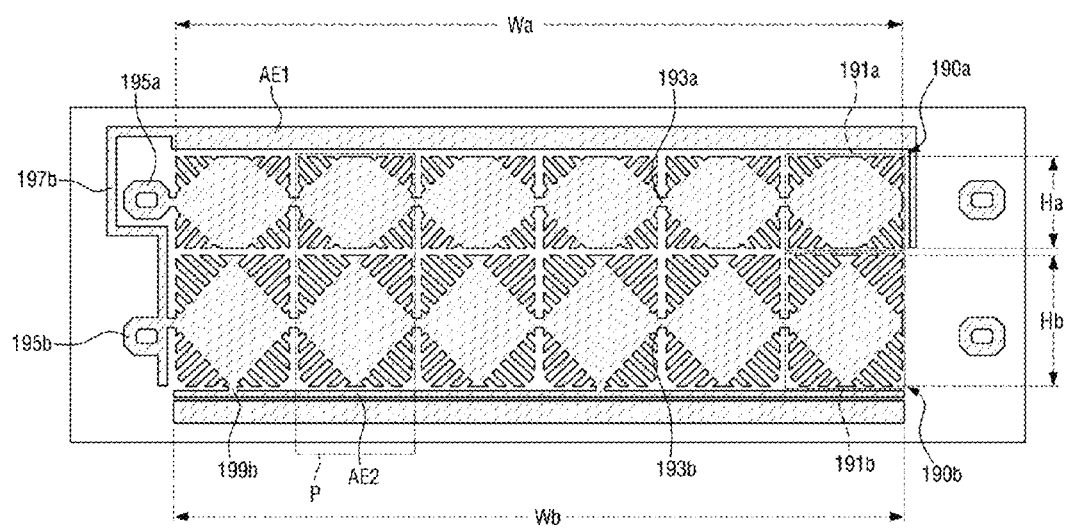
FIG. 6 is a layout view of a pixel electrode separated from the LCD of FIG. 3, according to exemplary embodiments.

FIG. 3 is a layout view of a pixel of the LCD of FIG. 1, according to exemplary embodiments. FIG. 4 is a layout view of a gate conductor separated from the LCD of FIG. 3. FIG. 5 is a layout view of a data conductor separated from the LCD of FIG. 3. FIG. 6 is a layout view of a pixel electrode separated from the LCD of FIG. 3.

Referring to FIGS. 1 through 6, the LCD may include the array substrate 100 and the counter-substrate 200 facing each other, the liquid crystal layer 3 disposed between the array substrate 100 and the counter-substrate 200, and a pair of polarizers (not illustrated) attached to the outer surfaces of the array substrate 100 and the counter substrate 200.

The array substrate 100 may include a gate conductor including a first gate line 121 and a second gate line 124. The array substrate 100 may include an insulating substrate (not illustrated) upon which the first and second gate lines 121 and 124 are disposed.

The first gate line 121 and the second gate line 124 may mainly extend along a horizontal direction (or a first direction or an X1-X2 axis direction) and deliver a gate signal. The second gate line 124 may include a first gate electrode 124a, a second gate electrode 124b, and a third gate electrode 124c extending along a vertical direction (or a second direction or an Y1-Y2 axis direction). A portion of the second gate line 124 may extend in an upward direction (or an Y1 direction) of the second direction and protrude along the first direction to form the third gate electrode 124c. In addition, the portion of the second gate line 124 may further extend in the upward direction (or the Y1 direction) from the third gate electrode 124c and protrude along the first direction to form the first gate electrode 124a and the second gate electrode 124b. The first gate electrode 124a and the second gate electrode 124b may be connected with one another to form a protruding portion. In addition, the second gate line 124 may also include bent portions that protrude from a main line extending mainly along the horizontal direction (or the first direction or the X1-X2 axis direction). Although not illustrated, the first gate line 121 may also include a first gate electrode, a second electrode, and a third gate electrode. That is, the first gate line 121 may have substantially the same shape as the second gate line 124.

A gate insulating layer (not illustrated) may be located on the gate conductor 121 and 124. A plurality of semiconductors 154a, 154b, and 154c, which may be made of any suitable material, e.g., amorphous silicon, crystalline silicon, oxide, etc., may be disposed on the gate insulating layer. The semiconductors 154a, 154b, and 154c may include a first semiconductor 154a, a second semiconductor 154b, and a third semiconductor 154c. The first semiconductor 154a, the second semiconductor 154b, and the third semiconductor 154c may be respectively disposed on the first gate electrode 124a, the second gate electrode 124b, and the third gate electrode 124c.

A data conductor may be disposed on the first semiconductor 154a, the second semiconductor 154b, the third semiconductor 154c, and the gate insulating layer. The data conductor may include a first data line 171, a first drain electrode 175a, a second drain electrode 175b, a third source electrode 173c, a third drain electrode 175c, and a storage line 178.

The data line 171 may extend mainly along the vertical direction (or the second direction or the Y1-Y2 axis direction) and deliver a data signal. The data line 171 may intersect the first gate line 121 or the second gate line 124 from the perspective of a third axial direction (not shown), e.g., a Z1-Z2 extending out of and into the page, to define a pixel area. The data line 171 may include a first source electrode 173a and a second source electrode 173b, which may overlap the first gate electrode 124a and the second gate electrode 124b, which are connected to each other.

The storage line 178 may deliver a storage voltage Vcst. The storage line 178 may include a first portion 178a, which extends along the second direction to be substantially parallel to the data line 171, and a second portion 178b, which extends from the first portion 178a in the first direction to be substantially parallel to the first gate line 121 or the second gate line 124. The first portion 178a may intersect, from the perspective of the third axial direction (Z1-Z2), the first gate line 121 and the second gate line 124, and cross a center (or central area) of the pixel electrode 190, which will be described later in more detail. The second portion 178b may extend along an edge of the pixel area towards the third gate electrode 124c, and one end of the second portion 178b may form the third drain electrode 175c. It is also contemplated that the second portion 178b may additionally or alternatively extend between the pixel electrode 190 and the second gate line 124.

According to exemplary embodiments, the storage line 178 may be arranged at the same level as the data line 171. In other words, the storage line 178 may be formed on the same layer as the data line 171. The storage line 178 may be formed at the same time as the data line 171 and may be made of the same material as the data line 171. However, it is contemplated that any suitable number of materials and/or formation process(es) may be utilized in association with exemplary embodiments described herein.

The first drain electrode 175a faces the first source electrode 173a, the second drain electrode 175b faces the second source electrode 173b, and the third drain electrode 175c faces the third source electrode 173c. The third source electrode 173c is connected to the second drain electrode 175b. The first gate electrode 124a, the first source electrode 173a, and the first drain electrode 175a may form a first thin-film transistor Qa together with the first semiconductor 154a. The second gate electrode 124b, the second source electrode 173b, and the second drain electrode 175b may form a second thin-film transistor Qb together with the second semiconductor 154b. The third gate electrode 124c, the third source electrode 173c, and the third drain electrode 175c may form a third thin-film transistor Qc together with the third semiconductor 154c. Channels of each of the first through third thin-film transistors Qa through Qc may be respectively formed in the semiconductors 154a, 154b, and 154c between the source electrodes 173a, 173b, and 173c and the drain electrodes 175a, 175b, and 175c.

An exposed portion, such as a space between the source electrode 173a, 173b, or 173c and the drain electrode 175a, 175b, or 175c, uncovered by the data conductor may exist in each semiconductor 154a, 154b, and 154c. A passivation layer (not shown) may be disposed on the data conductor and the exposed portion of each semiconductor 154a, 154b, and 154c. The passivation layer may be made of any suitable material, such as, for example, an inorganic insulating material, e.g., silicon nitride, silicon oxide, etc.

The pixel electrode 190, a first auxiliary electrode AE1, and a second auxiliary electrode AE2 may be disposed on the passivation layer. The pixel electrode 190 may be made of any suitable material, such as, for instance, a transparent conductive material. For example, the pixel electrode 190 may be made of a transparent conductive material, such as aluminum zinc oxide (AZO), gallium zinc oxide (GZO), indium tin oxide (ITO), indium zinc oxide (IZO), indium tin zinc oxide (ITZO), etc. It is also contemplated that one or more conductive polymers (ICP) may be utilized, such as, for example, polyaniline (PANI), poly(3,4-ethylenedioxythiophene)poly(styrenesulfonate)(PEDOT:PSS), etc.

The pixel electrode 190 may be disposed in the pixel area defined by the first gate line 121, the second gate line 124, and the data line 171. The pixel electrode 190 may include a first subpixel electrode 190a and a second subpixel electrode 190b separated from each other. The first subpixel electrode 190a and the second subpixel electrode 190b may be separated from each other along the first direction (or the X1-X2 axis direction), such that the first subpixel electrode 190a is disposed above (in the Y1-Y2 axis direction) the second subpixel electrode 190b. A width Wa of the first subpixel electrode 190a in the first direction (or the X1-X2 axis direction) may be greater than a height Ha of the first subpixel electrode 190a in the second direction (or the Y1-Y2 axis direction). Further, a width Wb of the second subpixel electrode 190b in the first direction (or the X1-X2 axis direction) may be greater than a height Hb of the second subpixel electrode 190b in the second direction (or the Y1-Y2 axis direction). In other words, long sides of the first subpixel electrode 190a and long sides of the second subpixel electrode 190b may be substantially parallel to the direction in which the first gate line 121 or the second gate line 124 extends. In addition, short sides of the first subpixel electrode 190a and short sides of the second subpixel electrode 190b may extend substantially parallel to the direction in which the data line 171 extends.

It is noted that if long sides of the pixel electrode 190 extend along the direction in which the data line 171 extends, parasitic capacitance between the pixel electrode 190 and the data line 171 to which a data voltage is applied may increase. On the other hand, according to exemplary embodiments, short sides of the pixel electrode 190 are arranged along the direction in which the data line 171 extends, and the long sides of the pixel electrode 190 are arranged along the direction in which the first gate line 121 or the second gate line 124 extends. In this manner, the parasitic capacitance that otherwise increases in proportion to a distance between the pixel electrode 190 and the data line 171 can be reduced.

An area ratio of the first subpixel electrode 190a to the second subpixel electrode 190b may differ from 1:1. The area of the first subpixel electrode 190a may be smaller than that of the second subpixel electrode 190b. The height Ha of the first subpixel electrode 190a in the second direction (or the Y1-Y2 axis direction) may be smaller than the height Hb of the second subpixel electrode 190b in the second direction (or the Y1-Y2 axis direction). In addition, the width Wa of the first subpixel electrode 190a in the first direction (or the X1-X2 axis direction) may be substantially equal to or smaller than the width Wb of the second subpixel electrode 190b in the first direction (or the X1-X2 axis direction).

The first subpixel electrode 190a may be disposed relatively more adjacent to the first gate line 121 than the second subpixel electrode 190b, and may be separated from the first gate line 121 when seen in a plan view. In other words, the first gate line 121 and the first subpixel electrode 190a may be disposed without overlapping each other when seen in a plan view. The second subpixel electrode 190b may be disposed relatively more adjacent to the second gate line 124 than the first subpixel electrode 190a, and may be separated from the second gate line 124 when seen in a plan view. In other words, the second gate line 124 and the second subpixel electrode 190b may be disposed without overlapping each other when seen in a plan view.

According to exemplary embodiments, the first subpixel electrode 190a may include a first extension portion 195a extending toward the first thin-film transistor Qa. The first extension portion 195a may be connected to the first drain electrode 175a of the first thin-film transistor Qa by a first contact hole 185a. That is, the first subpixel electrode 190a may be connected to the first thin-film transistor Qa by the first contact hole 185a. The second subpixel electrode 190b may include a second extension portion 195b extending toward the second thin-film transistor Qb. The second extension portion 195b may be connected to the second drain electrode 175b of the second thin-film transistor Qb by a second contact hole 185b. That is, the second subpixel electrode 190b may be connected to the second thin-film transistor Qb by the second contact hole 185b.

The first subpixel electrode 190a may include a plurality of first unit pixel electrodes 191a arranged along the first direction (or the X1-X2 axis direction) and a plurality of first connection portions 193a connecting the first unit pixel electrodes 191a. Each of the first unit pixel electrodes 191a may include a first plate and a plurality of first micro branches connected to the first plate. Each of the second unit pixel electrodes 191b may include a second plate and a plurality of second micro branches connected to the second plate. The first unit pixel electrodes 191a and the second unit pixel electrodes 191b will be described in greater detail later.

The first auxiliary electrode AE1 may overlap the first gate line 121. The first auxiliary electrode AE1 may function as a shield electrode for an electric field of the first gate line 121. In this manner, the first auxiliary electrode AE1 can reduce the parasitic capacitance between the pixel electrode 190 and the first gate line 121. That is, the first auxiliary electrode AE1 may function as a shield electrode for a pixel adjacent in the Y1 direction to the illustrated pixel. A width of the first auxiliary electrode AE1 in the second direction (or the Y1-Y2 axis direction) may be substantially equal to or greater than a width of the first gate line 121 in the second direction. It is also contemplated that the first auxiliary electrode AE1 may completely cover the first gate line 121 along the second direction when seen in a plan view. In this manner, a greater shield effect can be obtained. Moreover, the first auxiliary electrode AE1 may be made of the same material as the pixel electrode 190, and may be arranged at the same level (or the same layer) as the pixel electrode 190. That is, the first auxiliary electrode AE1 may be formed at the same time as the pixel electrode 190 in the same process. It is contemplated, however, that disparate materials and/or processes may be utilized to form the first auxiliary electrode AE1 and the pixel electrode 190.

The first auxiliary electrode AE1 may be connected to the second subpixel electrode 190b. In this manner, the first auxiliary electrode AE1 may receive a voltage applied to the second subpixel electrode 190b. The first auxiliary electrode AE1 may be connected to the second extension portion 195b of the second subpixel electrode 190b by a connection portion 197b, as illustrated in the drawings, but exemplary embodiments are not limited thereto.

The second auxiliary electrode AE2 may be disposed between the pixel electrode 190 and the second gate line 124. When seen in a plan view, the second auxiliary electrode AE2 may be disposed between the second subpixel electrode 190b and the second gate line 124 without overlapping the second subpixel electrode 190b and the second gate line 124. In addition, the second auxiliary electrode AE2 may be disposed without overlapping the first auxiliary electrode AE1 of a neighboring pixel, which overlaps the second gate line 124. The second auxiliary electrode AE2 may be shaped like a bar extending substantially along the first direction (or the X1-X2 axis direction). The second auxiliary electrode AE2 may have one body that is not divided into multiple portions. However, exemplary embodiments are not limited thereto, and the second auxiliary electrode AE2 may also consist of two or more portions. If the second portion 178b of the storage line 178 is disposed between the pixel electrode 190 and the second gate line 124, at least part of the second auxiliary electrode AE2 may overlap the second portion 178b of the storage line 178.

According to exemplary embodiments, the second auxiliary electrode AE2 may be made of the same material as the pixel electrode 190 and may be arranged at the same level (or the same layer) as the pixel electrode 190. That is, the second auxiliary electrode AE2 may be formed at the same time as the pixel electrode 190 in the same process. It is contemplated, however, that disparate materials and/or processes may be utilized to form the second auxiliary electrode AE2 and the pixel electrode 190. The second auxiliary electrode AE2 may be connected to the second subpixel electrode 190b by a connection portion 199b. In this manner, the second auxiliary electrode AE2 may receive a voltage applied to the second subpixel electrode 190b. While two connection portions 199b are illustrated in the drawings, the exemplary embodiments are not limited thereto.

If the pixel illustrated in FIG. 3 is referred to as an $n^{th}$ pixel, and if a pixel (not illustrated) disposed adjacent to the $n^{th}$ pixel in the Y2 direction is referred to as an $(n+1)^{th}$ pixel, voltages of different polarities may be applied to the $n^{th}$ pixel and the $(n+1)^{th}$ pixel as part of driving the LCD. The first auxiliary electrode AE1 overlapping the second gate line 124 may be connected to the pixel electrode 190 of the $(n+1)^{th}$ pixel. As such, a voltage applied to the pixel electrode 190 of the $n^{th}$ pixel and a voltage applied to the first auxiliary electrode AE1 that overlaps the second gate line 124 may have different polarities. A voltage difference due to the different polarities may cause liquid crystal molecules to collide with each other in an area between the first auxiliary electrode AE1 overlapping the second gate line 124 and the second subpixel electrode 190b. As the liquid crystal molecules collide with each other, the leakage of light due to texture may occur at low gray levels.

On the other hand, according to exemplary embodiments, the second auxiliary electrode AE2 is disposed between the second subpixel electrode 190b and the second gate line 124 to move an area (hereinafter, referred to as a "liquid crystal collision area") in which liquid crystal molecules collide with each other toward the outside of the pixel area. In this manner, the leakage of light visible from the outside can be prevented (or otherwise reduced). The second subpixel electrode 190b and the second auxiliary electrode AE2 may be connected to each other, and the same voltage may be applied to the second auxiliary electrode AE2 and the second subpixel electrode 190b. In this manner, the liquid crystal collision area can be moved more effectively toward the outside of the pixel area, and, thus, more effectively preventing (or otherwise reducing) the leakage of light at low gray levels.

A lower alignment layer (not illustrated) may be formed on the pixel electrode 190. The lower alignment layer may be a vertical alignment layer, and may be an alignment layer containing a photoreactive material.

The counter-substrate 200 may include the common electrode 270, which may be disposed on the whole surface of the insulating substrate (not shown) and receives the common voltage Vcom. The counter substrate 200 may further include a light-blocking member 250.

The light-blocking member 250 may also be referred to as a black matrix, and is configured to prevent the leakage of light. The light-blocking member 250 may extend along the first gate line 121 and the second gate line 124. The light-blocking member 250 may not only cover an area in which the first thin-film transistor Qa, the second thin-film transistor Qb, and the third thin-film transistor Qc are disposed, but may also extend along the data line 171 and cover an area around the data line 171. An area not covered by the light-blocking member 250 may be an area that displays an image by emitting light.

The common electrode 270 may be made of any suitable material, such as, for example, any suitable transparent conductive material. The common electrode 270 may include a plurality of liquid crystal control portions. To this end, the common electrode 270 may include a plurality of first liquid crystal control portions 271a respectively facing the first unit pixel electrodes 191a and a plurality of second liquid crystal control portions 271b respectively facing the second unit pixel electrodes 191b. Each of the first and second liquid crystal control portions 271a and 271b may be cross-shaped. The first liquid crystal control portions 271a and the second liquid crystal control portions 271b may improve the control of liquid crystal molecules.

According to exemplary embodiments, the first liquid crystal control portions 271a and the second liquid crystal control portions 271b may be implemented as slits formed in the common electrode 270. However, exemplary embodiments are not limited thereto. For instance, the first liquid crystal control portions 271a and the second liquid crystal control portions 271b may be implemented as protrusions. For descriptive and illustrative purposes, the first liquid crystal control portions 271a and the second liquid crystal control portions 271b being implemented as cross-shaped slits will be described in more detail below.

As seen in FIG. 3, the first liquid crystal control portions 271a neighboring each other along the first direction (or the X1-X2 axis direction) may be disposed without being connected to each other. The second liquid crystal control portions 271b neighboring each other along the first direction may be disposed without being connected to each other. Also, the first liquid crystal control portion 271a and the second liquid crystal control portion 271b neighboring each other along the second direction (or the Y1-Y2 axis direction) may be disposed without being connected to each other.

The common electrode 270 may also include an additional liquid crystal control portion 273a, which may be disposed around the intersection of horizontal and vertical parts of each of the cross-structured first liquid crystal control portions 271a. The additional liquid crystal control portion 273a may be implemented as a generally diamond-shaped slit pattern. To this end, an additional liquid crystal control portion 273b may be disposed around the intersection of horizontal and vertical parts of each of the cross-structured second liquid crystal control portions 271b. The additional liquid crystal controller 273b may be implemented as a generally diamond-shaped slit pattern. The diamond-shaped slit patterns 273a and 273b may have various sizes depending on exemplary embodiments. It is noted that too small a slit pattern may not adequately function as a liquid crystal control portion, and too large a slit pattern may reduce transmittance of the pixel. As such, the slit patterns 273a and 273b may be formed to appropriate sizes depending on exemplary embodiments. The diamond-shaped slit patterns 273a and 273b, which are the additional liquid crystal control portions 273a and 273b, may further improve the control of liquid crystal molecules. In this manner, it may be possible to increase response speed by controlling the liquid crystal molecules to be aligned more rapidly by an electric field imposed upon the liquid crystal layer 3.

An upper alignment layer (not illustrated) may be formed under the common electrode 270. The upper alignment layer may be a vertical alignment layer, and may be an alignment layer optically aligned using a photopolymerization material. It is contemplated, however, that any other suitable upper alignment layer may be utilized in association with exemplary embodiments described herein.

The aforementioned polarizers (not illustrated) may be provided on the outer surfaces of the array substrate 100 and the counter substrate 200. Transmission axes of the polarizers may be orthogonal to each other. However, the polarizers may also be disposed on the outer surface of any one of the array substrate 100 and the counter-substrate 200.

The liquid crystal layer 3 may have negative dielectric anisotropy; however, exemplary embodiments are not limited thereto. Liquid crystal molecules of the liquid crystal layer 3 may be aligned, such that their long axes are perpendicular to the surfaces of the array substrate 100 and the counter-substrate 200 in the absence of an electric field. In this manner, incident light may be prevented from passing through the polarizers in the absence of an electric field. The liquid crystal layer 3 may contain a polymer polymerized by light, such as ultraviolet (UV) light. If the alignment direction of the liquid crystal molecules of the liquid crystal layer 3 is fully controlled even without a polymer that provides a pre-tilt angle, the liquid crystal layer 3 may be provided without a polymer. Depending on exemplary embodiments, an alignment layer (not shown) formed on the counter-substrate 200 and the array substrate 100 may contain a polymer polymerized by light such as UV light.

Figure 7:
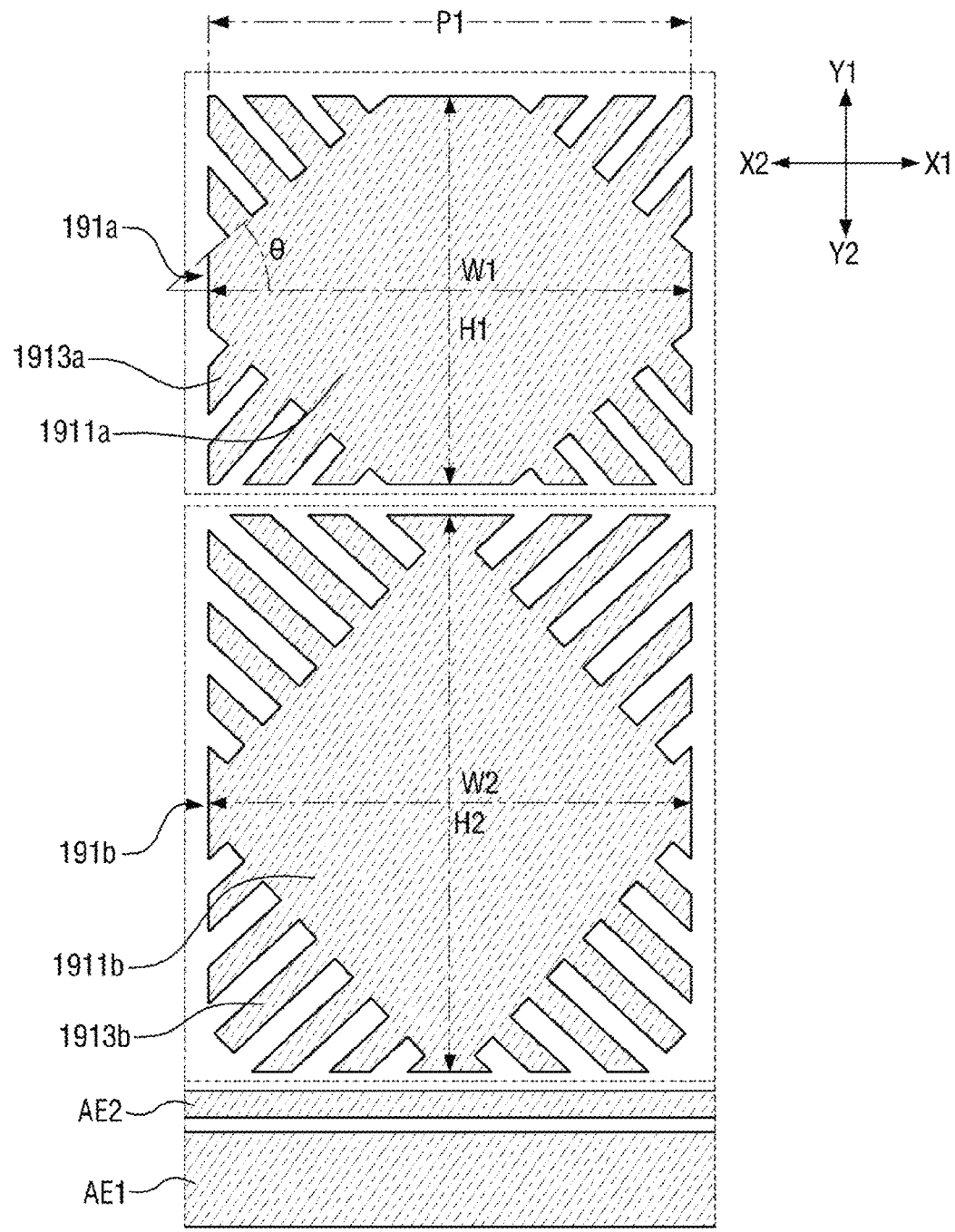
FIG. 7 is an enlarged view of a portion P of the pixel electrode illustrated in FIG. 6, according to exemplary embodiments.

FIG. 7 is an enlarged view of portion P of the pixel electrode illustrated in FIG. 6, according to exemplary embodiments.

Referring to FIGS. 1 through 7, each first unit pixel electrode 191a may include a first plate 1911a and a plurality of first micro branches 1913a protruding obliquely from the first plate 1911a. To this end, each second unit pixel electrode 191b may include a second plate 1911b and a plurality of second micro branches 1913b protruding obliquely from the second plate 1911b. A horizontal width W1 of the first plate 1911a may be substantially equal to a horizontal width W2 of the second plate 1911b. Further, the horizontal width W1 of the first plate 1911a may be substantially equal to a horizontal width P1 of the first unit pixel electrode 191a or the second unit pixel electrode 191b. The horizontal width W1 of the first plate 1911a may be equal to or greater than a vertical height H1 of the first plate 1911a, and an angle θ formed between the first plate 1911a and the first micro branches 1913a may be 45 degrees or less. The vertical height H2 of the second unit pixel electrode 191b may be greater than the vertical height H1 of the first unit pixel electrode 191a.

Figure 8:
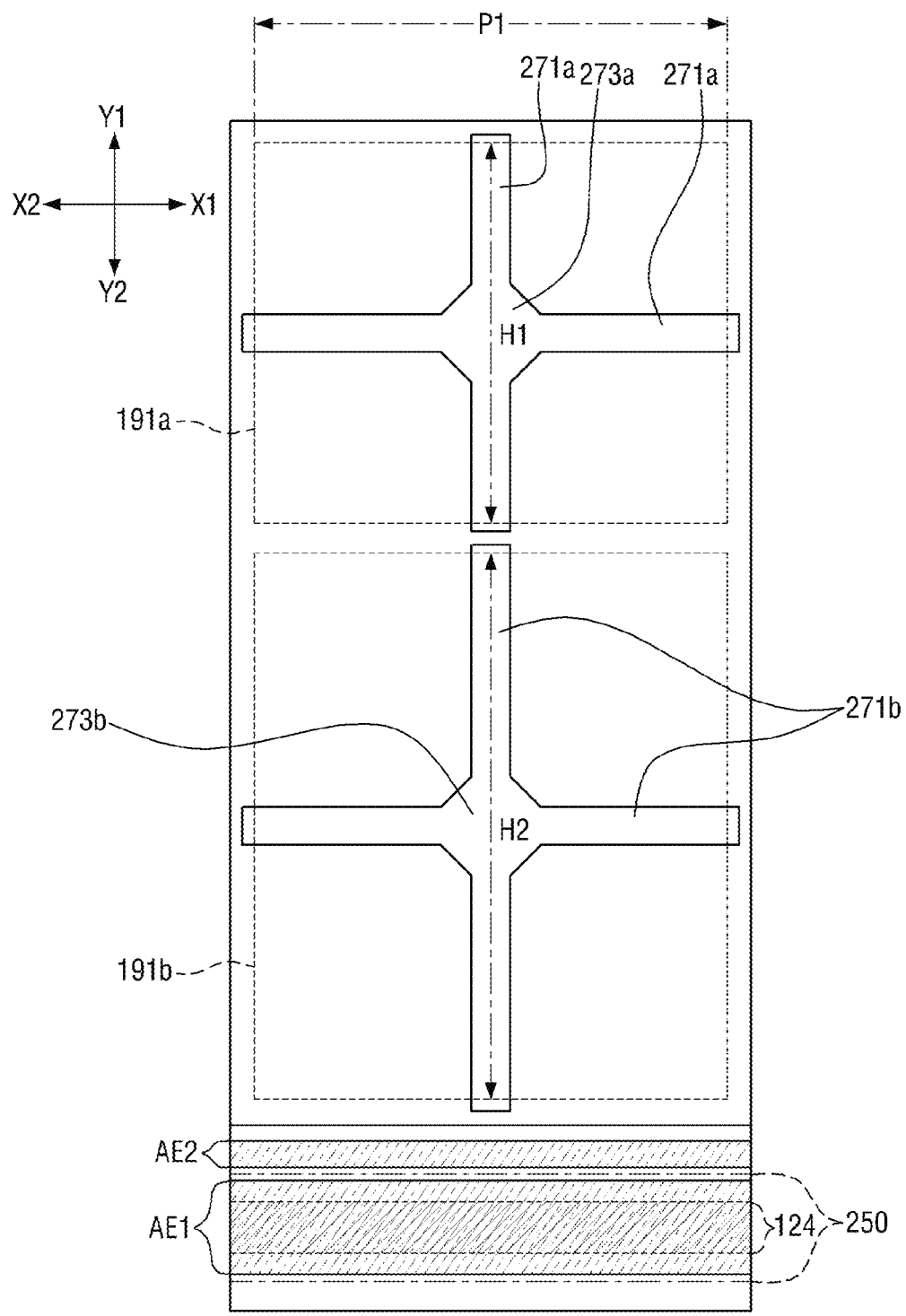
FIG. 8 is an enlarged view of a portion P of a common electrode of the LCD illustrated in FIG. 3, according to exemplary embodiments.

FIG. 8 is an enlarged view of a portion P of the common electrode 270 of the LCD illustrated in FIG. 3, according to exemplary embodiments.

Referring to FIGS. 1 through 8, the common electrode 270 may include a cross-structured first liquid crystal control portion 271a corresponding to each first unit pixel electrode 191a. The first liquid crystal control portion 271a may be implemented as a cross-structured slit. In addition, an additional liquid crystal control portion 273a may be formed at a center of the cross-structure. The additional liquid crystal control portion 273a may be implemented as a diamond-shaped slit pattern overlapping the cross-structured slit at its center.

The common electrode 270 may also include a cross-structured second liquid crystal control portion 271b corresponding to each second unit pixel electrode 191b. The second liquid crystal control portion 271b may be implemented as a cross-structured slit. In addition, an additional liquid crystal control portion 273b may be formed at a center of the cross structure. The additional liquid crystal control portion 273b may be implemented as a diamond-shaped slit pattern overlapping the cross-structured slit at its center.

According to exemplary embodiments, a horizontal length (or a length in the X1-X2 axis direction) of each of the first liquid crystal control portion 271a and the second liquid crystal control portion 271b may be substantially equal to the width P1 of the first unit pixel electrode 191a or the second unit pixel electrode 191b. The vertical height of the cross-structured first liquid crystal control portion 271a may be substantially equal to the vertical height H1 of the first unit pixel electrode 191a. The vertical height of the cross-structured second liquid crystal control portion 271b may be substantially equal to the vertical height H2 of the second unit pixel electrode 191b.

Figure 9:
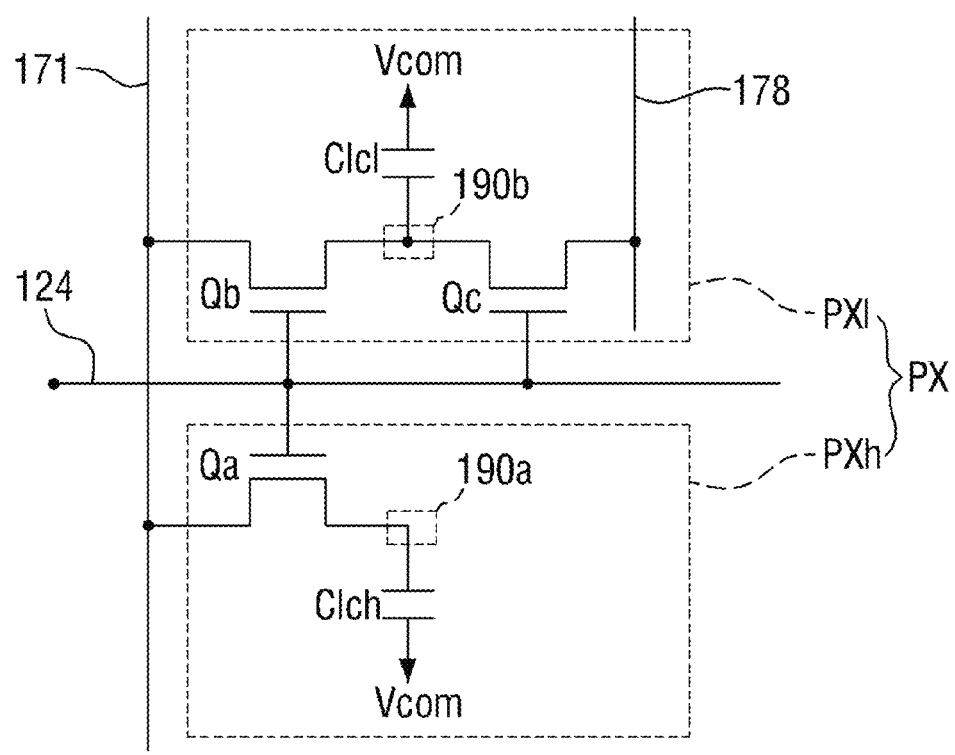
FIG. 9 is an equivalent circuit diagram of a pixel of the LCD of FIG. 3, according to exemplary embodiments.

FIG. 9 is an equivalent circuit diagram of a pixel of the LCD of FIG. 3, according to exemplary embodiments.

Referring to FIGS. 3 and 9, the LCD may include signal lines (e.g., the second gate line 124, which delivers a gate signal, the data line 171, which delivers a data signal, and the storage line 178, which delivers a storage voltage) and a pixel PX connected to the signal lines. Each pixel PX may include a high gray-level subpixel (also referred to as the first subpixel PXh) and a low gray-level subpixel (also referred to as the second subpixel PX1). The first subpixel PXh may include the first thin-film transistor Qa and the first liquid crystal capacitor Clch, and the second subpixel PX1 may include the second thin-film transistor Qb, the third thin-film transistor Qc, and the second liquid crystal capacitor Clcl. Each of the first thin-film transistor Qa and the second thin-film transistor Qb may be connected to the second gate line 124 and the data line 171, and the third thin-film transistor Qc may be connected to the second gate line 124 and an output terminal of the second thin-film transistor Qb.

The first thin-film transistor Qa may include a first control terminal connected to the second gate line 124, a first input terminal connected to the data line 171, and a first output terminal connected to the first liquid crystal capacitor Clch. In addition, the second thin-film transistor Qb may include a second control terminal connected to the second gate line 124, a second input terminal connected to the data line 171, and a second output terminal. The second output terminal of the second thin-film transistor Qb may be connected to the second liquid crystal capacitor Clcl and a third output terminal of the third thin-film transistor Qc. That is, the respective control terminals of the first thin-film transistor Qa and the second thin-film transistor Qb may be connected to the same second gate line 124, and the respective input terminals of the first thin-film transistor Qa and the second thin-film transistor Qb may be connected to the same data line 171. The first output terminal of the first thin-film transistor Qa may be connected to the first liquid crystal capacitor Clch, and the second output terminal of the second thin-film transistor Qb may be connected to the second liquid crystal capacitor Clcl and a third output terminal of the third thin-film transistor Qc.

The third thin-film transistor Qc may include a third control terminal connected to the second gate line 124 to which the first thin-film transistor Qa is connected, the third output terminal connected to the second output terminal of the second thin-film transistor Qb, and the third input terminal connected to a conductive line. The conductive line may be the storage line 178 to which the storage voltage Vcst is applied.

When the gate-on voltage Von is applied to the second gate line 124, the first thin-film transistor Qa, the second thin-film transistor Qb, and the third thin-film transistor Qc connected to the second gate line 124 are turned on. In this manner, a data voltage applied to the data line 171 is delivered to the first subpixel electrode 190a and the second subpixel electrode 190b, which form respective terminals of the first liquid crystal capacitor Clch and the second liquid crystal capacitor Clcl, via the first thin-film transistor Qa and the second thin-film transistor Qb, respectively. A data voltage applied to the first subpixel electrode 190a and a data voltage applied to the second subpixel electrode 190b may have the same value. The data voltage applied to the second subpixel electrode 190b may be divided by the third thin-film transistor Qc connected in series to the second thin-film transistor Qb. Therefore, the data voltage applied to the second subpixel electrode 190b may be smaller than the data voltage applied to the first subpixel electrode 190a.

According to exemplary embodiments, a voltage charged in the first liquid crystal capacitor Clch and a voltage charged in the second liquid crystal capacitor Clcl may be different. When the voltage charged in the first liquid crystal capacitor Clch and the voltage charged in the second liquid crystal capacitor Clcl are different, liquid crystal molecules may tilt at different angles in the first subpixel PXh and the second subpixel PX1, thus, causing the first and second subpixels PXh and PX1 to have different luminance. To this end, an image viewed from the side can be made as close to an image viewed from the front as possible by appropriately adjusting the voltage charged in the first liquid crystal capacitor Clch and the voltage charged in the second liquid crystal capacitor Clcl. In this manner, lateral visibility can be improved.

As described above, the voltage charged in the first liquid crystal capacitor Clch and the voltage charged in the second liquid crystal capacitor Clcl may be different. In a low gray-level area having a small data voltage, the first liquid crystal capacitor Clch connected to the first subpixel electrode 190a, to which a relatively large voltage is applied, is charged with electric charge. However, the second liquid crystal capacitor Clcl connected to the second subpixel electrode 190b, which is charged with a lower voltage than an applied data voltage, may lack an electrical charge. Therefore, in the low gray-level area having a small data voltage, the brightness of the pixel PX may be determined by the first subpixel electrode 190a.

Figure 10:
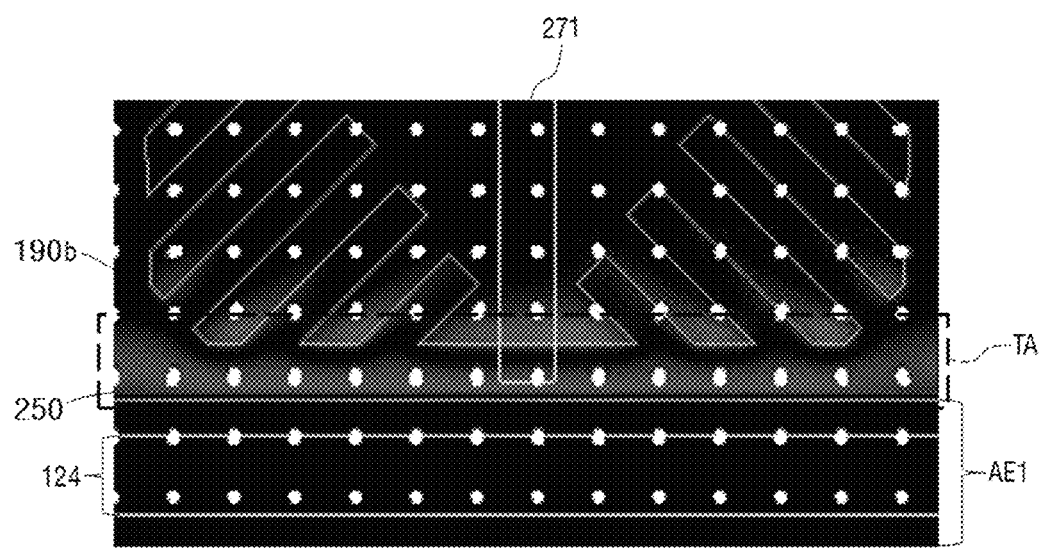
FIGS. 10 and 11 illustrate experimental results of a comparative LCD without a second auxiliary electrode.
Figure 11:
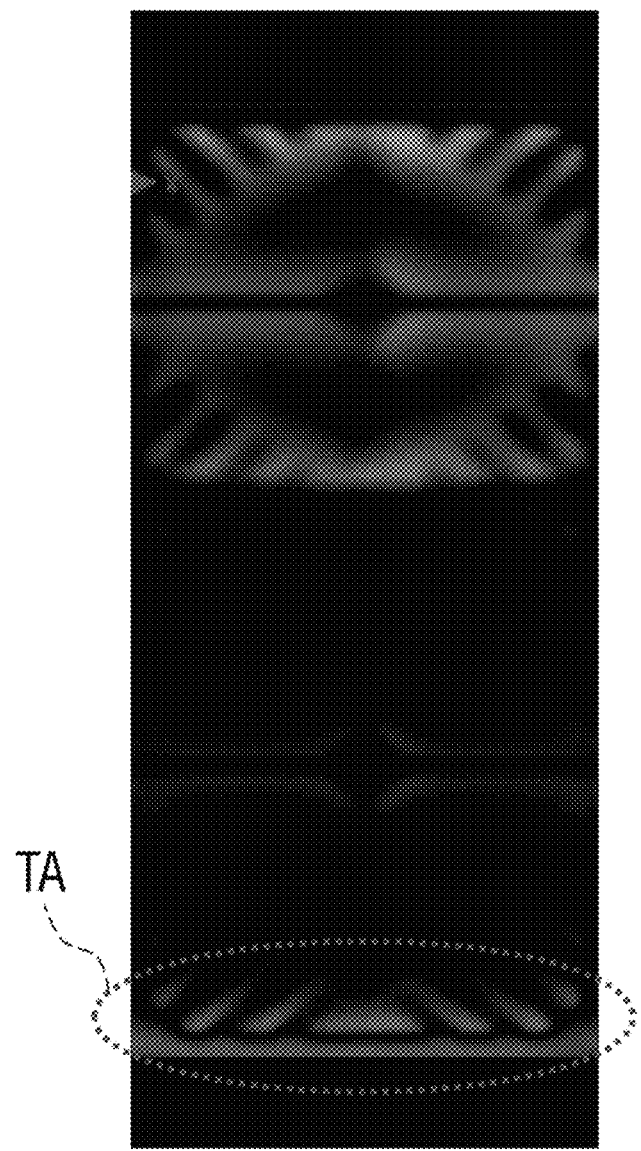
Figure 12:
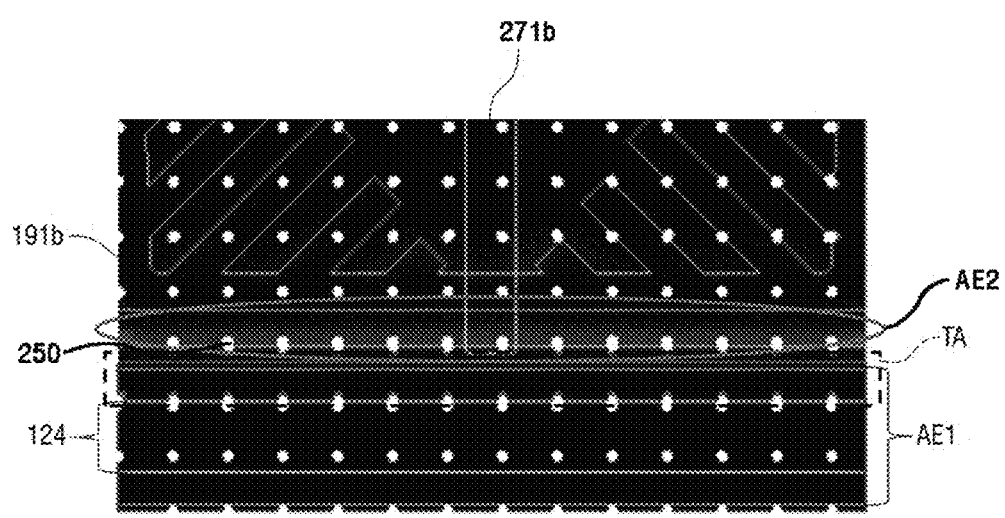
FIGS. 12 and 13 illustrate experimental results of an LCD, according to exemplary embodiments.
Figure 13:
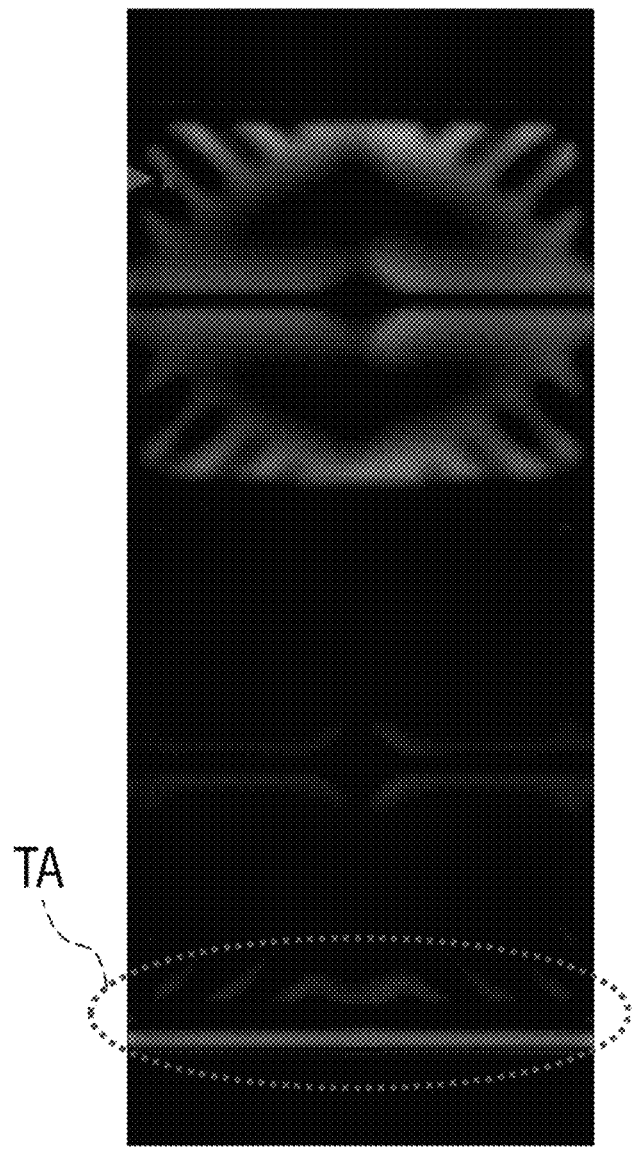

FIGS. 10 and 11 illustrate experimental results of a comparative LCD without a second auxiliary electrode. FIGS. 12 and 13 illustrate experimental result of an LCD, according to exemplary embodiments.

Referring to FIGS. 3 and 10 through 13, a first auxiliary electrode AE1 that overlaps a second gate line 124 of FIG. 10 may be connected to a pixel electrode of a neighboring pixel. Therefore, a voltage of a polarity different from that of a voltage applied to a second subpixel electrode 190b of FIG. 10 may be applied to the first auxiliary electrode AE1. That is, voltages applied to the second subpixel electrode 190b and the first auxiliary electrode AE1 of FIG. 10 during driving of the LCD may have different polarities. As such, a liquid crystal collision area TA may be disposed between the second subpixel electrode 190b and the first auxiliary electrode AE1 or between the second subpixel electrode 190b and the second gate line 124. Texture may be created in the liquid crystal collision area TA. In addition, the liquid crystal collision area TA may be disposed inside a pixel area and in a portion uncovered by, e.g., a light-blocking member 250; that is, in a portion between the second subpixel electrode 190b and the first auxiliary electrode AE1 or between the second subpixel electrode 190b and the second gate line 124. As such, leakage of light may occur around the second subpixel electrode 190b.

FIG. 11 illustrates the luminance of the comparative LCD of FIG. 10 at low gray levels. As apparent from FIG. 11, leakage of light occurs in the liquid crystal collision area TA.

Referring to FIG. 12, an exemplary LCD may include a second auxiliary electrode AE2 between a second subpixel electrode 190b and a first auxiliary electrode AE1. The second auxiliary electrode AE2 may be connected to the second subpixel electrode 190b as described above. In this manner, the same voltage may be applied to the second subpixel electrode 190b and the second auxiliary electrode AE2 during driving of the LCD. In addition, since voltages applied to the second subpixel electrode 190b and the first auxiliary electrode AE1 have different polarities, a liquid crystal collision area TA is moved relatively closer to a second gate line 124 or the first auxiliary electrode AE1 compared with the comparative example of FIG. 10. That is, the liquid crystal collision area TA can be moved relatively closer to the outside of a pixel area. In addition, since the liquid crystal collision area TA moved by the second auxiliary electrode AE2 can be covered by, e.g., a light-blocking member 250, the leakage of light can be suppressed as compared with the comparative example.

FIG. 13 illustrates the luminance of the LCD of FIG. 12 at low gray levels. As apparent from FIG. 13, leakage of light is suppressed as compared with the comparative example of FIG. 11.

Figure 14:
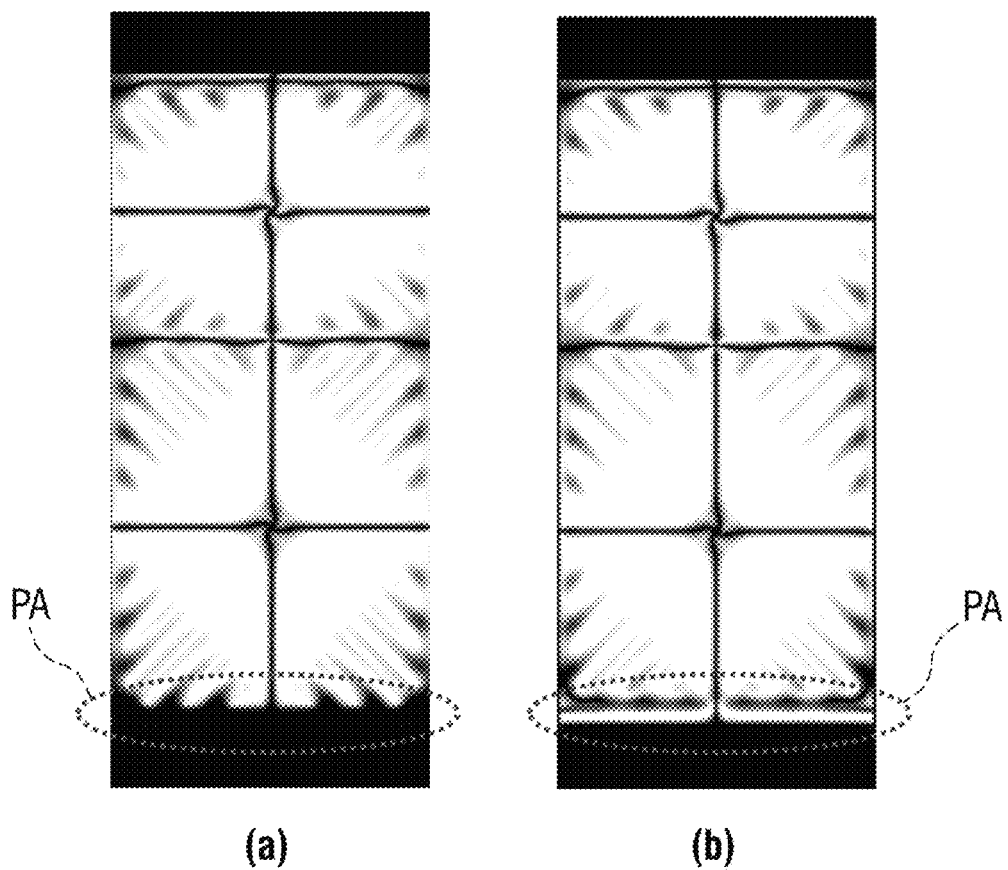
FIG. 14 illustrates experimental results comparing exemplary embodiments of an LCD at high gray levels to a comparative example.

FIG. 14 illustrates experimental results comparing exemplary embodiments of an LCD at high gray levels to a comparative example.

Referring to FIG. 14, in an LCD without a second auxiliary electrode, light cannot transmit through a lower area PA of a second subpixel electrode 190b as illustrated in (a) of FIG. 14, whereas in an LCD including a second auxiliary electrode AE2, additional light in the area of the second auxiliary electrode AE2 can transmit through a lower area PA of a second subpixel electrode 190b, as illustrated in (b) of FIG. 14.

According to exemplary embodiments, an array substrate may be provided to improve display quality. To this end, an LCD may include the array substrate to improve display quality of the LCD. It is contemplated, however, that exemplary embodiments may be incorporated into other forms of display devices, such as other forms of flat panel displays.

Although certain exemplary embodiments and implementations have been described herein, other embodiments and modifications will be apparent from this description.

Accordingly, the inventive concept is not limited to such embodiments, but rather to the broader scope of the presented claims and various obvious modifications and equivalent arrangements.

What is claimed is:

1. An array substrate, comprising:
   a first gate line and a second gate line, the first and second gate lines extending substantially along a first direction;
   a data line extending substantially along a second direction crossing the first direction, the data line being insulated from the first and second gate lines;
   a pixel electrode disposed in a pixel area defined in association with the data line, the first gate line, and the second gate line;
   a first auxiliary electrode overlapping the first gate line; and
   a second auxiliary electrode disposed between the pixel electrode and the second gate line, the second auxiliary electrode being spaced apart from the second gate line,
   wherein the pixel electrode comprises:
      a first subpixel electrode disposed adjacent to the first gate line, a size of the first subpixel electrode in the first direction being greater than a size of the first subpixel electrode in the second direction; and
      a second subpixel electrode spaced apart from the first subpixel electrode in the second direction, a size of the second subpixel electrode in the first direction being greater than a size of the second subpixel electrode in the second direction.

2. The array substrate of claim 1, wherein at least one of the first auxiliary electrode and the second auxiliary electrode is connected to the second subpixel electrode.

3. The array substrate of claim 1, wherein:
   at least one of the first auxiliary electrode and the second auxiliary electrode is made of the same material as the second subpixel electrode; and
   at least one of the first auxiliary electrode and the second auxiliary electrode is disposed in the same layer as the second subpixel electrode.

4. The array substrate of claim 1, further comprising:
   a first thin-film transistor comprising a first terminal connected to the second gate line, a second terminal connected to the data line, and a third terminal connected to the first subpixel electrode;
   a second thin-film transistor comprising a fourth terminal connected to the second gate line, a fifth terminal connected to the data line, and a sixth terminal connected to the second subpixel electrode; and
   a third thin-film transistor comprising a seventh terminal connected to the second gate line, an eighth terminal connected to the fifth terminal of the second thin-film transistor, and a ninth terminal connected to a conductive line.

5. The array substrate of claim 1, wherein:
   the first subpixel electrode comprises a plurality of first unit pixel electrodes arranged along the first direction and connected to each other; and
   the second subpixel electrode comprises a plurality of second unit pixel electrodes arranged along the first direction and connected to each other.

6. The array substrate of claim 5, wherein:
   each of the first unit pixel electrodes comprises a first plate and a plurality of first micro branches extending from the first plate; and
   each of the second unit pixel electrodes comprises a second plate and a plurality of second micro branches extending from the second plate.

7. The array substrate of claim 5, wherein a size of any one of the first unit pixel electrodes in the first direction is equal to a size of any one of the second unit pixel electrodes in the first direction.

8. The array substrate of claim 1, further comprising:
   a storage line comprising a first portion extending along the second direction and intersecting the data line and the pixel electrode, and a second portion connected to the first portion and extending along the first direction,
   wherein the second portion overlaps the second auxiliary electrode.

9. The array substrate of claim 8, wherein:
   the storage line is made of the same material as the data line; and
   the storage line is disposed in the same layer as the data line.

10. A display apparatus, comprising:
    a first substrate;
    a second substrate spaced apart from the first substrate, the second substrate comprising a common electrode; and
    a liquid crystal layer disposed between the first substrate and the second substrate,
    wherein the first substrate comprises:
       a first gate line and a second gate line, the first and second gate lines extending substantially along a first direction;
       a data line extending substantially along a second direction crossing the first direction, the data line being insulated from the first and second gate lines;
       a pixel electrode disposed in a pixel area defined in association with the data line, the first gate line, and the second gate line;
       a first auxiliary electrode overlapping the first gate line; and
       a second auxiliary electrode disposed between the pixel electrode and the second gate line, the second auxiliary electrode being spaced apart from the second gate line, and
    wherein the pixel electrode comprises:
       a first subpixel electrode disposed adjacent to the first gate line, a size of the first subpixel electrode in the first direction being greater than a size of the first subpixel electrode in the second direction; and
       a second subpixel electrode spaced apart from the first subpixel electrode in the second direction, a size of the second subpixel electrode in the first direction being greater than a size of the second subpixel electrode in the second direction.

11. The display apparatus of claim 10, wherein at least one of the first auxiliary electrode and the second auxiliary electrode is connected to the second subpixel electrode.

12. The display apparatus of claim 10, wherein:
    at least one of the first auxiliary electrode and the second auxiliary electrode is made of the same material as the second subpixel electrode; and
    at least one of the first auxiliary electrode and the second auxiliary electrode is disposed in the same layer as the second subpixel electrode.

13. The display apparatus of claim 10, wherein:
    the first subpixel electrode comprises a plurality of first unit pixel electrodes arranged along the first direction and connected to each other; and
    the second subpixel electrode comprises a plurality of second unit pixel electrodes arranged along the first direction and connected to each other.

14. The display apparatus of claim 13, wherein each of the first unit pixel electrodes comprises a first plate and a plurality of micro branches extending from the first plate, and each of the second unit pixel electrodes comprises a second plate and a plurality of micro branches extending from the second plate.

15. The display apparatus of claim 13, wherein a size of any one of the first unit pixel electrodes in the first direction is equal to a size of any one of the second unit pixel electrodes in the first direction.

16. The display apparatus of claim 13, wherein the common electrode comprises a substantially cross-structured liquid crystal control portion overlapping a first unit pixel electrode or a second unit pixel electrode.

17. The display apparatus of claim 16, wherein the common electrode further comprises an additional liquid crystal control portion disposed in a central region of the cross-structured liquid crystal control portion.

18. The display apparatus of claim 10, further comprising:
   a first thin-film transistor comprising a first terminal connected to the second gate line, a second terminal connected to the data line, and a third terminal connected to the first subpixel electrode;
   a second thin-film transistor comprising a fourth terminal connected to the second gate line, a fifth terminal connected to the data line, and a sixth terminal connected to the second subpixel electrode; and
   a third thin-film transistor comprising a seventh terminal connected to the second gate line, an eighth terminal connected to the fifth terminal of the second thin-film transistor, and a ninth terminal connected to a conductive line.

19. The display apparatus of claim 10, wherein the first substrate further comprises:
   a storage line comprising a first portion extending along the second direction and intersecting the data line and the pixel electrode, and a second portion connected to the first portion and extending along the first direction,
   wherein the second portion overlaps the second auxiliary electrode.

20. The display apparatus of claim 10, wherein the first subpixel electrode is configured to receive a relatively higher-level voltage than the second subpixel electrode.

* * * * *